United States Patent
Andry et al.

(10) Patent No.: US 9,620,824 B1
(45) Date of Patent: Apr. 11, 2017

(54) MICRO BATTERY DESIGN AND DIAGNOSIS

(71) Applicant: INTERNATIONAL BUSINESS MACHINES CORPORATION, Armonk, NY (US)

(72) Inventors: Paul S. Andry, Yorktown Heights, NY (US); Qiang Huang, Croton on Hudson, NY (US); Yu Luo, Hopewell Junction, NY (US); Adinath S. Narasgond, Yonkers, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/970,644

(22) Filed: Dec. 16, 2015

(51) Int. Cl.
*H01M 10/48* (2006.01)
*H01M 10/0585* (2010.01)
*G01R 31/36* (2006.01)

(52) U.S. Cl.
CPC ........ *H01M 10/48* (2013.01); *G01R 31/3627* (2013.01); *H01M 10/0585* (2013.01); *H01M 2220/30* (2013.01)

(58) Field of Classification Search
CPC ..................................................... H01M 10/48
USPC ............................................................. 429/120
See application file for complete search history.

(56) References Cited

U.S. PATENT DOCUMENTS

| | | | |
|---|---|---|---|
| 4,143,212 A | 3/1979 | Ueno et al. | |
| 5,037,713 A | 8/1991 | Yoshino et al. | |
| 8,999,571 B2 | 4/2015 | Chiang et al. | |
| 2008/0081256 A1 | 4/2008 | Madou et al. | |
| 2009/0208834 A1* | 8/2009 | Ramasubramanian | H01M 4/13 429/149 |
| 2013/0224632 A1 | 8/2013 | Roumi | |
| 2013/0280579 A1* | 10/2013 | Wright | H01M 10/0565 429/124 |
| 2015/0303489 A1* | 10/2015 | Wang | H01M 6/34 429/90 |

FOREIGN PATENT DOCUMENTS

| | | | |
|---|---|---|---|
| FR | 2416560 A1 | 4/1969 | |
| JP | 04245171 A1 | 9/1992 | |

OTHER PUBLICATIONS

List Of IBM Patents Or Patent Applications Treated As Related; (Appendix P), Date Filed: Dec. 14, 2016; 2 pages.
U.S. Appl. No. 15/341,579; filed Nov. 2, 2016; Entitled: Micro Battery Design and Diagnosis.

* cited by examiner

*Primary Examiner* — Basia Ridley
*Assistant Examiner* — James Erwin
(74) *Attorney, Agent, or Firm* — Cantor Colburn LLP; Louis Percello (57) ABSTRACT

Embodiments include methods and products for evaluating microbatteries. The microbattery includes a cathode layer, an anode layer physically separated from the cathode layer, and an electrolyte layer in contact with the anode and the cathode. The microbattery also includes at least one auxiliary electrode in physical contact with the electrolyte layer, the auxiliary electrode containing at least one metal coating and at least one non-conductive film, wherein the at least one metal coating is physically separated from the cathode and the anode.

21 Claims, 9 Drawing Sheets

MICRO BATTERY DESIGN AND DIAGNOSIS

BACKGROUND

The present disclosure relates to electrical energy sources, and particularly to micro batteries and micro battery diagnosis.

Conventional micro batteries can contain several components, including a cathode, an anode, and an electrolyte material. Such micro batteries can be used in a variety of applications. Industry demands ever smaller and more efficient energy sources, resulting in frequent testing and analysis of various component materials and battery designs. However, in a conventional battery, testing of individual component properties, such as impedance characteristics, can be difficult and in some cases only information concerning the fully assembled battery can be discerned, and not individual electrodes. It would be desirable to have the ability to test individual micro battery components to optimize battery materials and design.

SUMMARY

In accordance with an embodiment, a microbattery includes a cathode layer and an anode layer physically separated from the cathode layer. The microbattery also includes an electrolyte layer in physical contact with the anode layer and the cathode layer. The microbattery also includes at least one auxiliary electrode in physical contact with the electrolyte layer, the auxiliary electrode including at least one metal coating and at least one non-conductive film, wherein the at least one metal coating is physically separated from the cathode and the anode.

In accordance with another embodiment, a method of evaluating a micro battery, includes providing a micro battery containing a cathode layer and an anode layer physically separated from the cathode layer, and an electrolyte layer in contact with the anode and the cathode. The method also includes providing at least one auxiliary electrode in physical contact with the electrolyte layer, the auxiliary electrode comprising at least one metal coating and at least one non-conductive film, wherein the at least one metal coating is physically separated from the cathode and the anode. The method also includes forming a first electrical circuit between the auxiliary electrode and one of the cathode layer or the anode layer. The method also includes applying an external electrical potential to the first electrical circuit. The method also includes measuring one or more of a cathode layer property and an anode layer property.

In yet another embodiment, a method of evaluating a microbattery includes providing a micro battery. The microbattery includes a cathode layer, an anode layer physically separated from the cathode layer, an electrolyte layer in contact with the anode layer and the cathode layer, and a first auxiliary electrode and a second auxiliary electrode. Each of the first auxiliary electrode and the second auxiliary electrode are in physical contact with the electrolyte layer and each contains at least one metal coating and at least one non-conductive film. The at least one metal coating is physically separated from the cathode and the anode. The method also includes forming a first electrical circuit between the first auxiliary electrode and the second auxiliary electrode. The method also includes applying an external electrical potential to the first electrical circuit. The method also includes measuring a property of the electrolyte layer.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings.

FIGS. 1A-1C depict cross sectional views of conventional micro-batteries, in which:

DETAILED DESCRIPTION

In accordance with exemplary embodiments of the disclosure, a micro battery including an auxiliary electrode is provided. The micro battery of the disclosure can be subjected to an improved evaluation and analysis to measure separate properties and performance of the micro battery cathode, anode, or electrolyte. In embodiments of the disclosure, battery performance or degradation of performance of a given design after manufacture, upon storage, or over operational time can be evaluated with reference to individual battery components by using an auxiliary electrode as a reference or working electrode in combination with a cathode, an anode, or another auxiliary electrode.

Figure 1A:
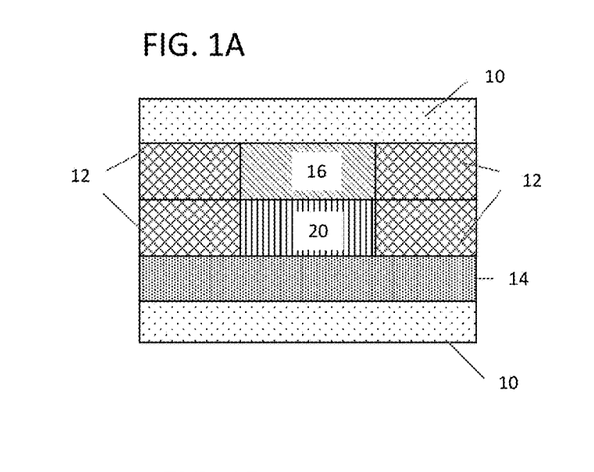
FIG. 1A depicts a cross sectional side view of an exemplary conventional micro-battery.
Figure 1B:
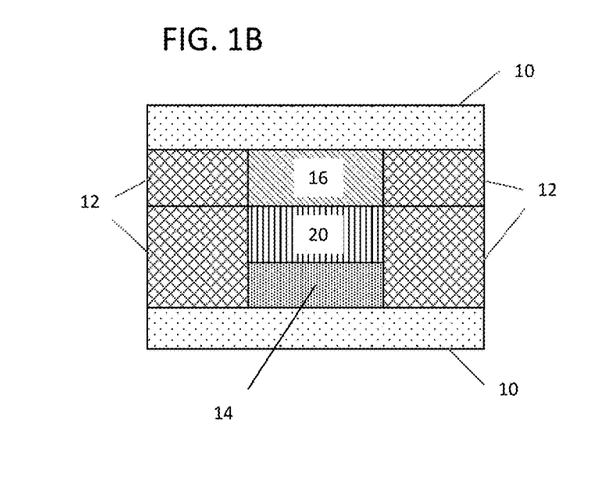
FIG. 1B depicts a cross sectional side view of another exemplary conventional micro-battery.
Figure 1C:
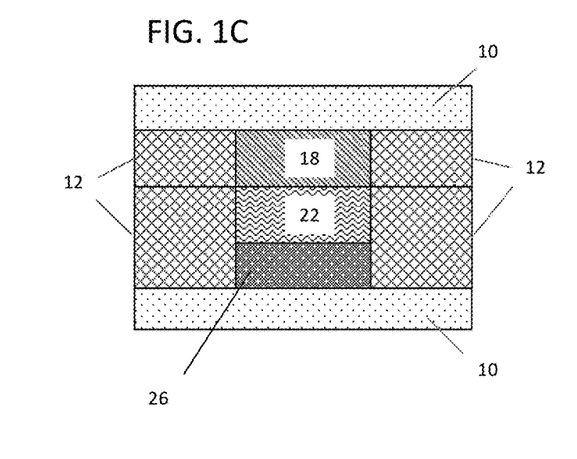
FIG. 1C depicts a cross sectional side view of yet another exemplary conventional micro-battery.

With reference now to the figures, FIGS. 1A-1C illustrate exemplary conventional micro batteries. As shown in FIG. 1A, an exemplary micro battery includes two current collectors 10. In between the current collectors are a cathode layer 16, an electrolyte layer 20, and an anode layer 14. As is shown, cathode layer 16 and anode layer 14 each have a side that is in physical contact with one of the current collectors 10 and another side that is in contact with the electrolyte layer 20, which physically separates the cathode layer 16 from the anode layer 14. The cathode layer 16 and electrolyte layer 20 can be physically isolated from components external to the micro battery with an insulating material 12, such as polymer. The anode layer 14 can be a universal anode such that it extends beyond the insulating layer 12 adjacent the cathode layer 16 and electrolyte layer 20 and is thereby not isolated from components external to the micro battery.

In other exemplary micro batteries, for example as illustrated in FIG. 1B, the anode layer 14 can be adjacent to an insulating material 12 such that it is isolated from components external to the micro battery.

FIG. 1C illustrates an exemplary micro battery, in which two current collectors 10 are provided and, in between the current collectors 10, are a cathode paste 18, an electrolyte in hydrogel 22, and a zinc anode 26. The cathode paste 18, electrolyte in hydrogel 22, and zinc anode 26 are isolated from external components with insulating material 12.

Figure 2A:
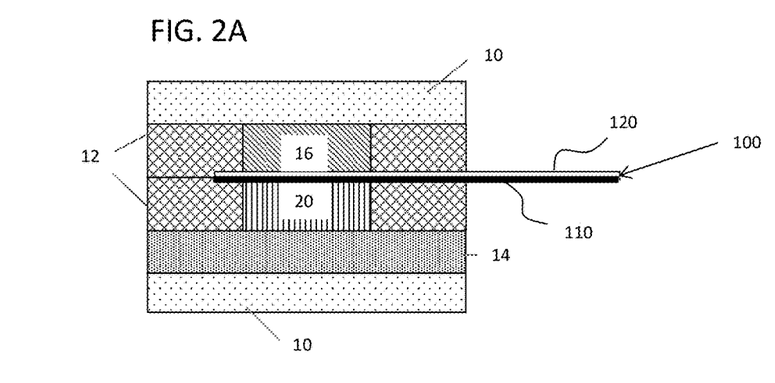
FIG. 2A depicts a cross sectional side view of a micro-battery with an electrically isolated microelectrode in accordance with an exemplary embodiment.

With reference to FIG. 2A, an embodiment of the disclosure includes a micro battery having two current collectors 10, a cathode layer 16 in contact with the first current collector and an anode layer 14 in contact with the second current collector. An electrolyte layer 20 is positioned between the cathode layer 16 and anode layer 14. In some embodiments, as shown, the micro battery can include insulating material isolating micro battery components from components and systems external to the micro battery. As shown in FIG. 2A, for example, insulating material 12 isolates the cathode layer 16 and electrolyte layer 20 from external components. As illustrated, an embodiment includes an auxiliary electrode 100. The auxiliary electrode 100 includes a metal coating 110 and a non-conductive film 120. The metal coating 110 contacts electrolyte layer 20 but is not in contact with cathode layer 16 or anode layer 14. Thus, the auxiliary electrode 100 is electrically isolated from the anode layer 14 and cathode layer 16, but is ionically connected to both layers. The auxiliary electrode 100 extends through the periphery of the micro battery to the exterior of the battery and is thereby accessible for application of a current, for example for battery testing and analysis.

The current collectors 10 can comprise conductive materials, including copper, nickel, gold, titanium, carbon, indium tin oxide, or any combination of such. In some embodiments, current collectors are conductive materials, including copper, nickel, gold, titanium, carbon, indium tin oxide, or any combination of such, coated on non-conductive materials, such as polymer.

The anode layer 14 and cathode layer 16 are electrodes and can be composed of any material useful as an electrode in a micro battery system. A cathode layer 16 can include, for example, an oxide, such as iron oxide, cuprous oxide, cupric oxide, cobaltic oxide, manganese dioxide, lead dioxide, silver oxide, nickel dioxide, or silver dioxide, or it can include, for instance, ferrate, nickel oxyhydroxide, permanganate or bromate. In some embodiments, a cathode layer can include, for example, an amorphous vanadium-oxide, $VO_x$, thin film. In some embodiments, the cathode layer includes manganese, such as manganese dioxide. In some embodiments, the cathode layer includes a cathode paste, such as $Co_2O_3$ paste, or a $MnO_2$ paste. In some embodiments the cathode paste contains conductive material at least partly of one or more allotropes of carbon, such as carbon powder, carbon graphite powder or carbon nanotubes.

The anode layer 14 can include, for instance, a metal, such as copper, nickel, lead, iron, chromium, aluminum, magnesium, or zinc. For example, in embodiments of the invention, micro batteries contain high-capacity anodes made from porous silicon. In some embodiments, the anode is zinc. In some embodiments, the anode 14 is oxidized at a potential lower than the potential at which the cathode is reduced.

Insulating material 12 can electrically separate micro battery components from external components. The insulating material 12 can also protect micro battery components from air. For example, insulating material can be a polymer coating resistant to acidic electrolytes, such as an adhesive tape or film including a polyimide, polyethylene, polypropylene, polyurethane, PET, or an epoxy resin coating.

In accordance with the disclosure, the non-conductive film 120 is a thin flexible polymer strip composed of an insulating material. The non-conductive film 120 acts as a substrate for at least one layer of metal coating 110. For example, the non-conductive film can be a flexible polymeric material, such as a polymethylmethacrylate, polyamide, polycarbonate, polyethylene, polystyrene, polyvinyl chloride, polyethylene terephthalate, polyethylene naphtahlate, polypropylene, or polyimide material. In some embodiments, the non-conductive film is a Kapton substrate.

In some embodiments, the metal coating 110 consists of at least one metal, such as silver, gold, copper, platinum, zinc, palladium, tungsten, molybdenum, zirconium, tantalum, or combinations thereof. In preferred embodiments the metal coating includes a noble metal. In some embodiments, the metal includes platinum or zinc.

In some embodiments, the non-conductive film is coated on one side with the metal coating. In some embodiments, the non-conductive film is coated on multiple sides with a metal coating. In embodiments in which the non-conductive film is coated on multiple sides with a metal coating, the coated sides can be coated with the same metal coatings or with different metal coatings.

In some embodiments, as shown in FIG. 2A, the metal coating 110 faces in the direction of the anode layer 14. In such embodiments, an electrolyte layer can be optionally be positioned between the metal coating 110 and the cathode layer 16 or, in some embodiments, the auxiliary electrode 100 can be electrically isolated from the cathode layer 16 by the non-conductive film 120.

Figure 2B:
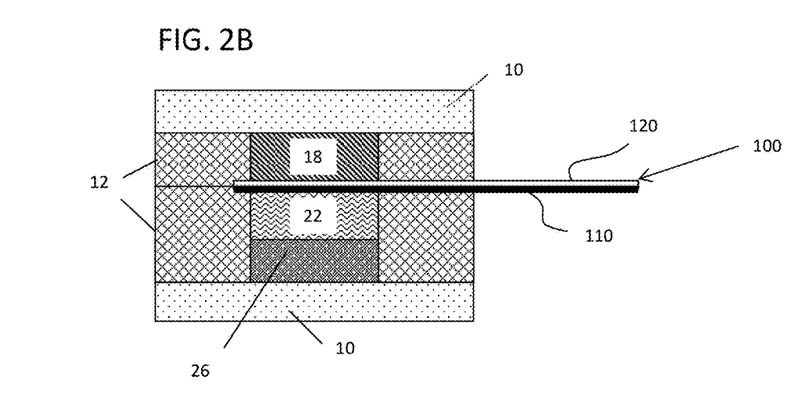
FIG. 2B depicts a cross sectional side view of a micro-battery with an electrically isolated microelectrode in accordance with another exemplary embodiment.

As shown in FIG. 2B, in some embodiments, a micro battery includes two current collectors 10 and, in between the current collectors 10, are a cathode paste 18, an electrolyte in hydrogel 22 and a zinc anode 26. Electrolyte in hydrogel can include, for example, an electrolyte solution of zinc chloride, ammonia chloride, potassium chloride, potassium hydroxide, and other salts and combination of salts. The hydrogel can be, for example, a silicon oxide gel, sodium silicate gel, and other materials. An auxiliary electrode 100 is positioned in between the cathode paste 18 and the zinc anode 26, such that the auxiliary electrode is electrically isolated from the cathode 18 and anode 26 but ionically connected to both of the cathode 18 and anode 26. As is shown in FIG. 2B, auxiliary electrode includes a metal coating 110 in contact with the electrolyte in hydrogel 22. A non-conductive film 120 of the auxiliary electrode 100 is adjacent the cathode paste 18.

Figure 3A:
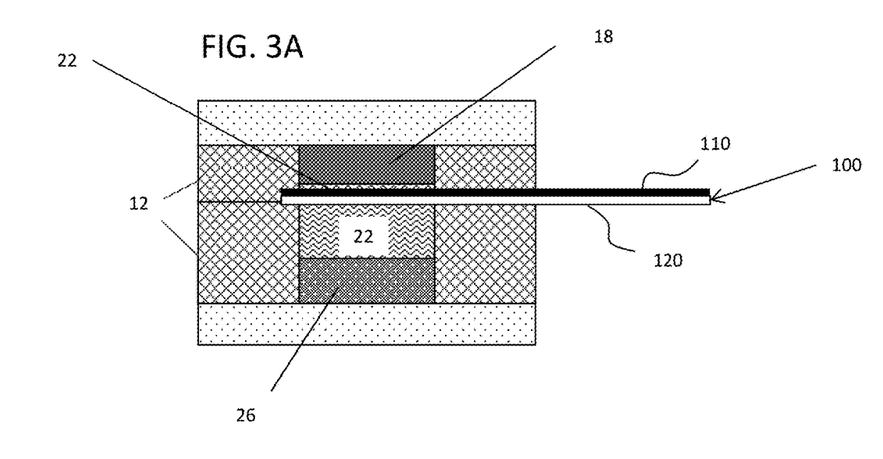
FIG. 3A depicts a cross sectional side view of a micro-battery with an electrically isolated microelectrode having hydrogel adjacent to a top and bottom microelectrode surface in accordance with an exemplary embodiment.

FIG. 3A depicts another embodiment of the disclosure, in which an auxiliary electrode 100 includes a metal coating 110 and a non-conductive film 120, in which the metal coating 110 and the non-conductive film 120 are in contact with electrolyte in hydrogel 22. The auxiliary electrode 100 is electrically isolated from the anode layer 14 and the cathode layer 16, but is ionically connected to both layers. In some embodiments, as shown, the metal coating 110 faces in the direction of the cathode layer 16. In such embodiments, as illustrated, an electrolyte layer is positioned between the metal coating 110 and the cathode layer 16.

Figure 3B:
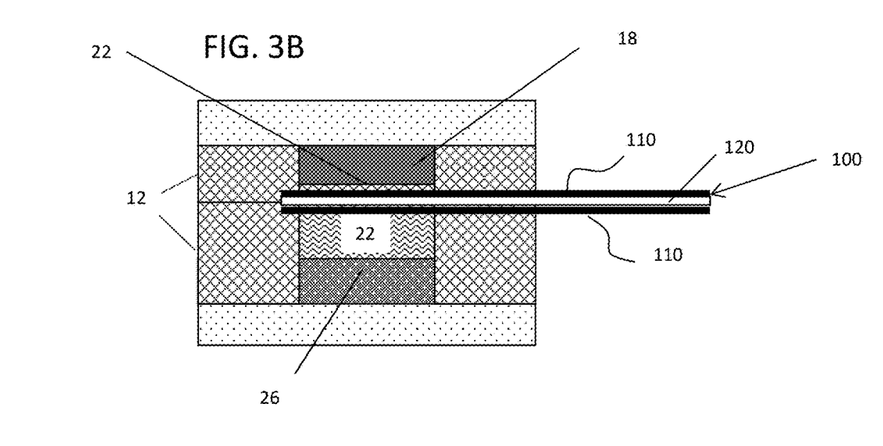
FIG. 3B depicts a cross sectional side view of a micro-battery with an electrically isolated microelectrode having hydrogel adjacent to a top and bottom microelectrode surface in accordance with another exemplary embodiment.

In some embodiments, as shown for example in FIG. 3B, an auxiliary electrode 100 contains more than one metal coating 110. For example, an auxiliary electrode 100 can have a metal coating 110 on a side of the auxiliary electrode 100 facing a cathode paste 18 and a second metal coating 110 on a side of the auxiliary electrode facing a zinc anode 26. A non-conductive layer 120 is positioned between the two metal coatings 110. Each metal coating 110 is electrically isolated from the cathode paste 18 and the zinc anode 26 but is ionically connected to both through electrolyte in hydrogel 22.

Figure 4A:
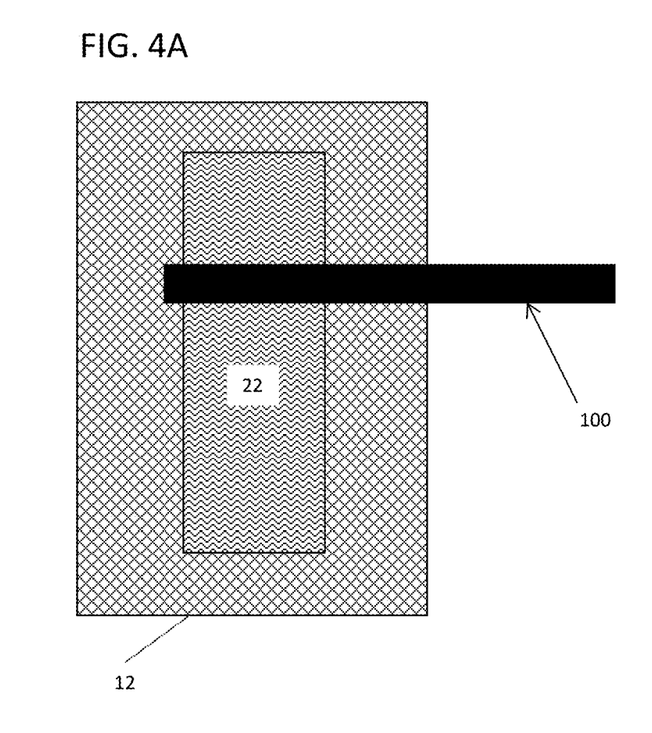
FIG. 4A depicts a top down cross sectional view of a micro-battery with an electrically isolated microelectrode in accordance with an exemplary embodiment.

FIG. 4A depicts a top down cross sectional view of an exemplary micro battery depicted in FIG. 3A, taken through the electrolyte in hydrogel 22. As is shown, an auxiliary electrode 100 contacts the electrolyte in hydrogel 22 and passes through insulating material 12 such that it is accessible outside of the micro battery.

Figure 4B:
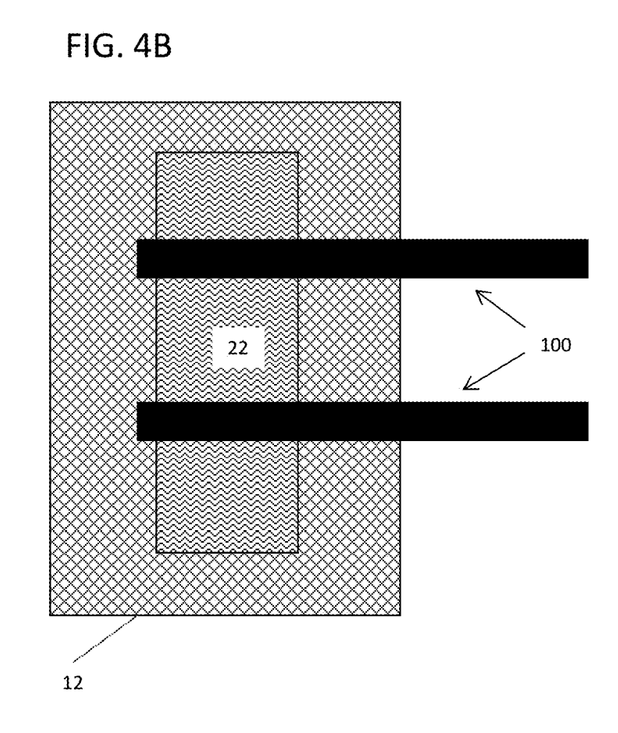
FIG. 4B depicts a top down cross sectional view of a micro-battery with two electrically isolated microelectrodes in accordance with another exemplary embodiment.

FIG. 4B depicts a top down cross sectional view of an exemplary micro battery according to another embodiment, taken through electrolyte in hydrogel 22. As is shown, multiple auxiliary electrodes 100 contact the electrolyte in hydrogel 22 and passes through insulating material 12 such that they are accessible outside of the micro battery. In some embodiments, a micro battery includes two auxiliary electrodes 100. In some embodiments, a micro battery includes more than two auxiliary electrodes, such as three or four auxiliary electrodes.

Figure 5:
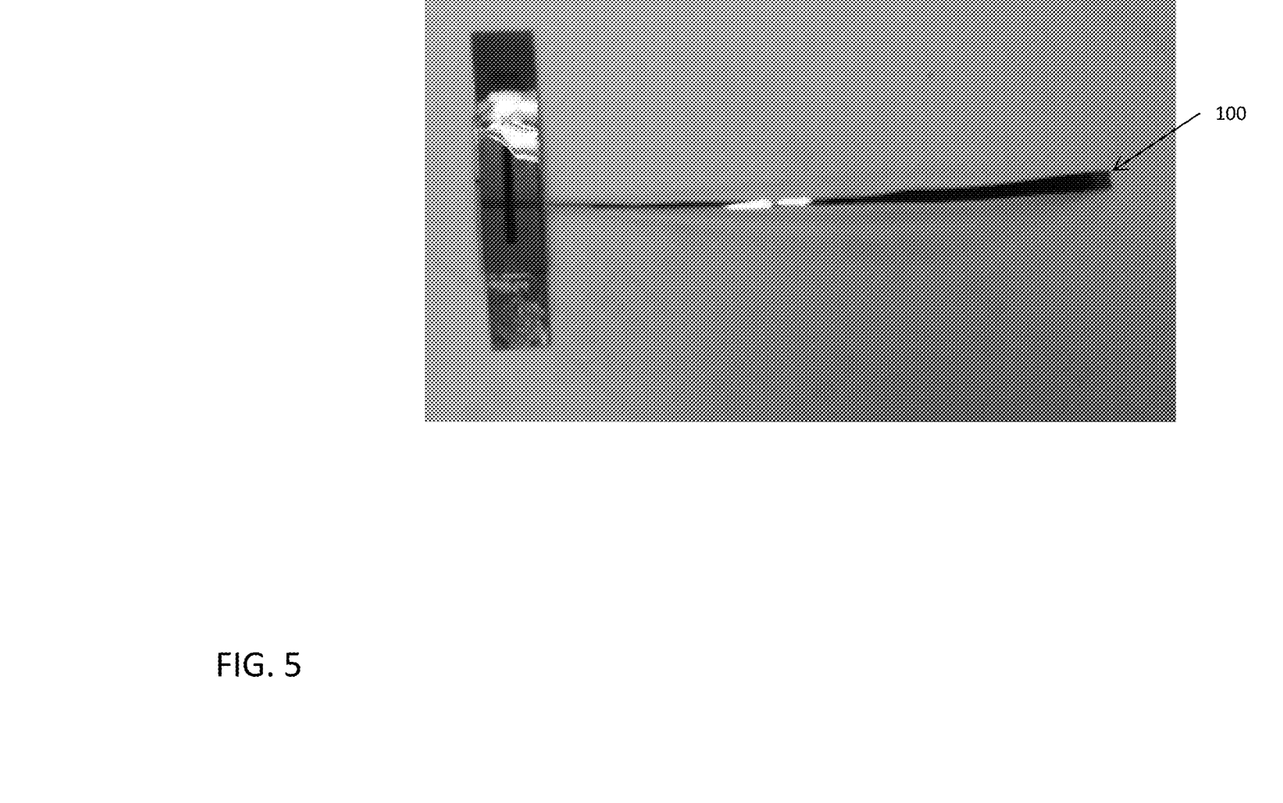
FIG. 5 is a photograph of an exemplary micro-battery in accordance with the disclosure.

FIG. 5 is a photograph of an exemplary zinc (Zn)-manganese oxide ($MnO_2$) micro battery with a platinum coated auxiliary electrode 100 in accordance with the disclosure. As is shown, auxiliary electrode 100 extends outside of the micro battery and is accessible, for example, for impedance spectroscopy.

In accordance with the disclosure, a method of testing a micro battery includes providing a micro battery with one or more auxiliary electrodes as disclosed herein. An electrical circuit between the auxiliary electrode and either the cathode or the anode can be formed and an external electrical potential can be applied to the auxiliary electrode-anode or auxiliary electrode-cathode circuit. The use of the auxiliary electrode as a reference can allow deconvolution of anode and cathode performance in testing and analysis of micro batteries.

For example, an electrical circuit between the anode and cathode can be formed and evaluated in a first test using standard techniques known to persons skilled in the art, such as Impedance Spectroscopy. Thereafter, an electrical circuit between the anode and auxiliary electrode can be formed and evaluated in a second test using the same standard techniques. Thereafter, an electrical circuit between the cathode and the auxiliary circuit can be formed and evaluated using a third test using the same standard techniques. Thereafter, comparison of the first, second, and third test results can reveal results that are attributable to one or the other of the cathode or the anode. In some embodiments, circuit resistance can be measured and compared. In some embodiments, charge transfer resistance can be measured and compared. In some embodiments, open circuit potential can be measured and compared.

Impedance spectroscopy using the auxiliary electrode as a reference electrode can be used to separately evaluate the battery anode and the battery cathode. Impedance spectroscopy using two auxiliary electrodes as a working electrode and a reference electrode can be used to evaluate the electrolyte.

In some embodiments, the auxiliary electrodes can be removed after battery evaluation. For example, in some embodiments, portions of the auxiliary electrodes can be cut from the device. In some embodiments, the auxiliary electrodes can be pulled from the device.

In some embodiments, a micro battery contains two auxiliary electrodes in contact with an electrolyte layer. In such embodiments, one auxiliary electrode can be used as a reference electrode and one as a working electrode to evaluate the electrolyte layer. A counter electrode can include a battery anode, battery cathode, or another auxiliary electrode. Measuring impedance at high frequency can indicate a series resistance between working and reference electrodes, which largely reflects the resistance of the electrolyte. Comparing the series resistance along the discharge of the battery, or of an aging battery, can indicate the electrolyte conductivity or concentration change, thereby providing diagnostic information.

In some embodiments, impedance is measured as a function of discharge time. In some embodiments, impedance is measured as a function of storage time.

Figure 8:
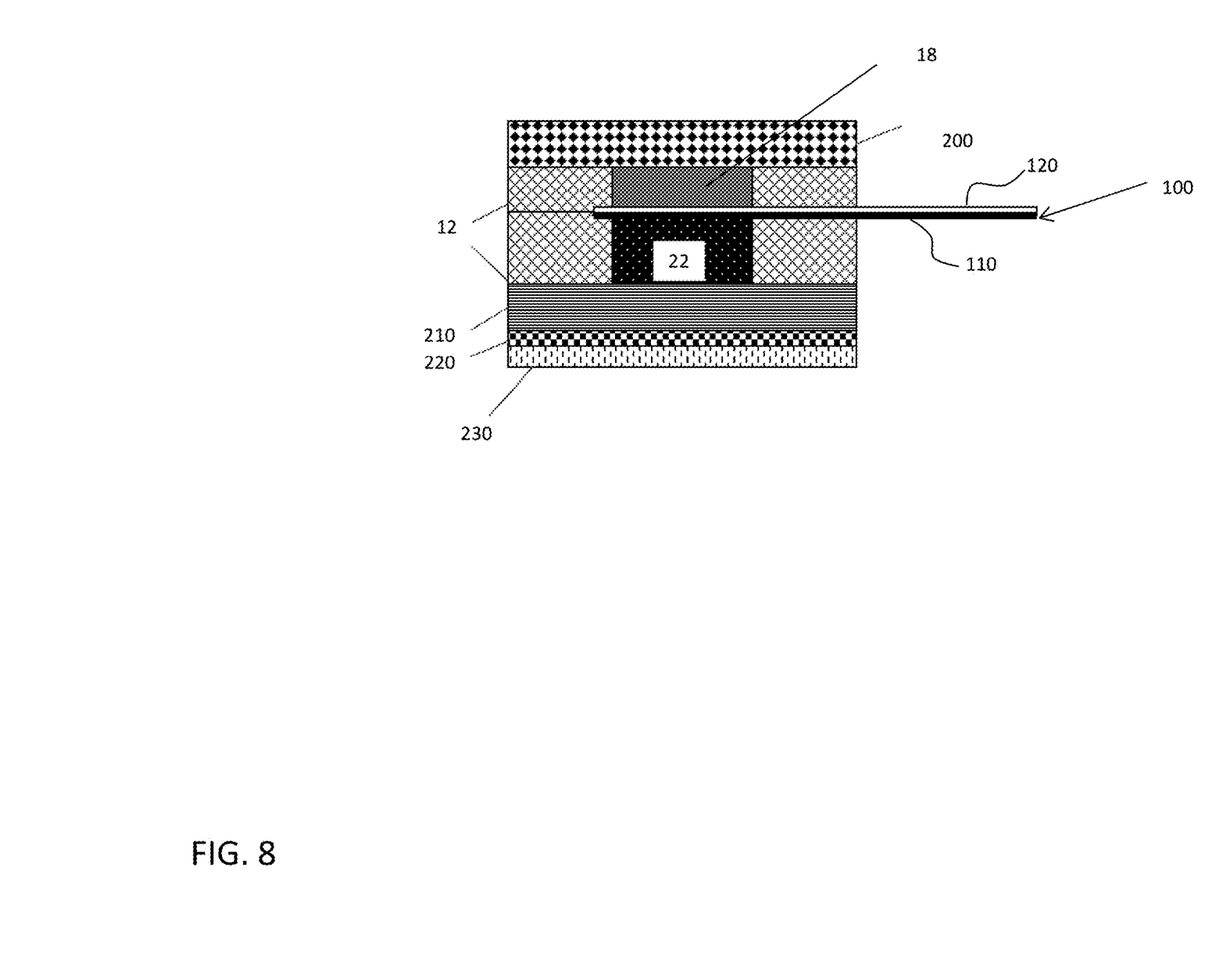
FIG. 8 is another exemplary micro battery in accordance with the disclosure.

An exemplary micro battery for use in an impedance test is depicted in FIG. 8. The micro battery includes a titanium current collector 200 in physical contact with a cathode paste 18. Cathode paste 18 is adjacent to an electrolyte in hydrogel 22. An auxiliary electrode 100 is positioned between the cathode paste 18 and the electrolyte hydrogel 22 such that a metal coating 110, such as platinum coating, is in physical contact with the electrolyte but electrically isolated from the cathode paste by way of the non-conducting strip 120, such as a Kapton strip. The electrolyte hydrogel is adjacent to a zinc anode 210, which rests atop a nickel/titanium layer 220, which in turn rests atop a Kapton layer 230. In an impedance test, the platinum of the auxiliary electrode 100 can be used as a reference electrode.

The dimensions of the micro battery can vary based upon the desired application. For example, in some embodiments, the micro battery has a length of 0.1 mm to 10 mm, such as from 0.5 mm to 10 mm, or from 0.5 mm to 5 mm. In some embodiments, the micro battery has a width of 0.1 mm to 10 mm, such as 0.5 mm to 10 mm, or from 0.5 mm to 5 mm. The micro battery can have a thickness of 0.1 mm to 1 mm, for example 0.1 mm to 0.8 mm, or 0.1 mm to 0.5 mm. In some embodiments, the micro battery has a trench width of 0.5 mm to 200 mm and a length of 5 mm to 300 mm.

EXAMPLE 1

Figure 6:
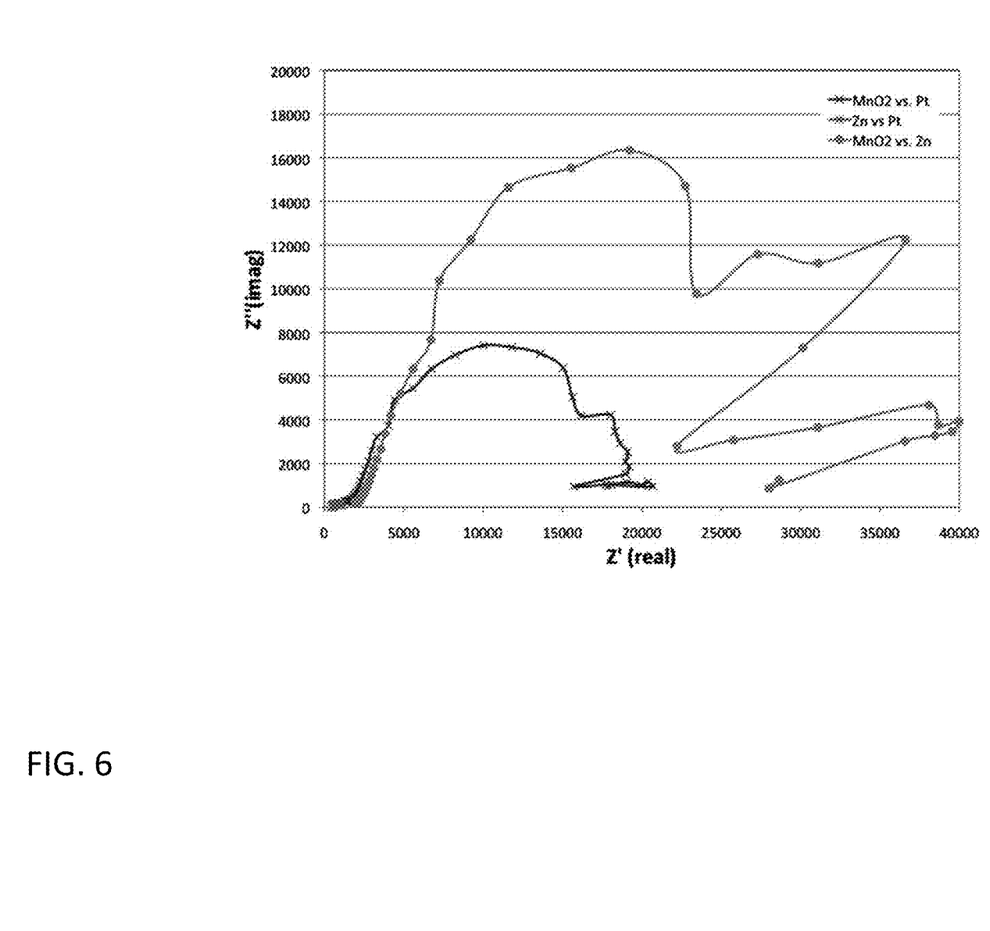
FIG. 6 is a Nyquist plot of impedance analysis for an exemplary micro battery in accordance with the disclosure tested before discharging.

A micro battery with a platinum auxiliary electrode in accordance with the disclosure was evaluated using impedance spectroscopy. The micro battery included a $MnO_2$ cathode paste and a Zn anode. Using the platinum auxiliary electrode as a reference, Open Circuit Potential (O.C.P./V) and circuit resistance were measured in a fresh battery. Results are depicted in Table 1 below. A Nyquist plot of the impedance spectroscopy is depicted in FIG. 6, wherein Rs is the resistance in series and Rc is the charge transfer resistance of the circuit.

TABLE 1

| Electrodes tested | O.C.P. (Volts) | Rs/(Ohms) | Rc/(Ohms) |
| --- | --- | --- | --- |
| $MnO_2$ vs. Zn | 1.69 | 2041 | 30000 |
| $MnO_2$ vs. Pt | 1.17 | 1431 | 17000 |
| Zn vs. Pt | −0.52 | 469 | 740 |

As is shown in Table 1, the Open Circuit Potential is measurable not only for the overall micro battery, but also is measurable through the auxiliary electrode, separately for the anode and for the cathode. Similarly, Impedance Spectroscopy reveals an overall micro battery series resistance of 2041 ohm and charge transfer resistance of about 30000 ohm when testing is conducted using the cathode and anode. Using the auxiliary electrode instead of either the cathode or the anode allows separate analysis of the cathode and anode. As is shown in Table 1, the cathode was evaluated against the auxiliary electrode and revealed a cathode series resistance of 1431 ohm and a cathode charge transfer resistance of 17000 ohm. Anode evaluated against the auxiliary electrode revealed an anode series resistance of 469 ohm and anode charge transfer resistance of 740 ohm. Thus, in this example, the main series resistance and main charge transfer resistance were determined to originate from the $MnO_2$ cathode.

EXAMPLE 2

Figure 7:
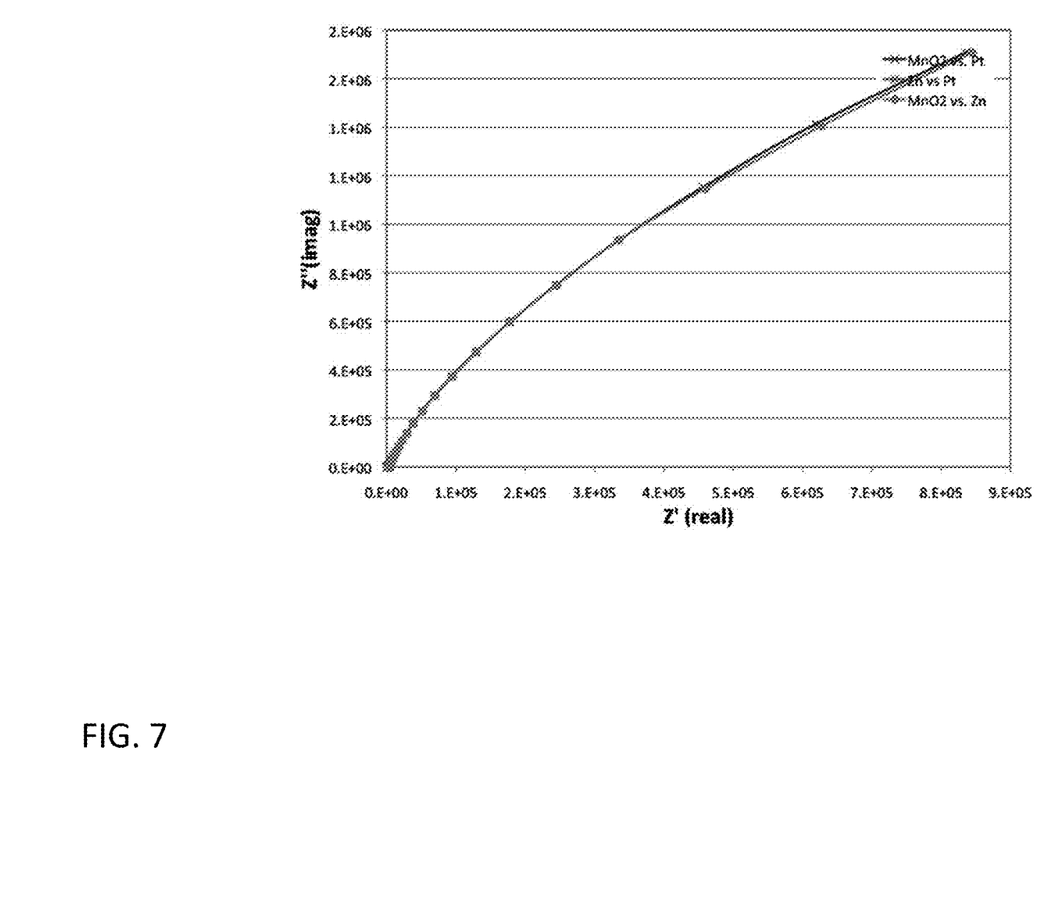
FIG. 7 is a Nyquist plot of impedance analysis for the same exemplary micro battery in FIG. 6 tested after being discharged for six hours.

The same micro battery described in EXAMPLE 1 was measured after a six hour discharge in a similar manner. Results are depicted in Table 2 below. A Nyquist plot of the impedance spectroscopy is depicted in FIG. 7.

TABLE 2

| Electrodes tested | O.C.P. (Volts) | Rs/(Ohms) | Rc/(Ohms) |
| --- | --- | --- | --- |
| $MnO_2$ vs. Zn | 1.18 | 3100 | greater than 8.0E+5 |
| $MnO_2$ vs. Pt | 0.70 | 2700 | greater than 8.0E+5 |
| Zn vs. Pt | −0.48 | 360 | 240 |

As is shown in Table 2, the auxiliary electrode allows separate evaluation of the anode and for the cathode. Impedance Spectroscopy reveals that degradation of the micro battery, or the increase in charge transfer resistance, after six hour discharge is attributable to the $MnO_2$ cathode.

EXAMPLE 3

Figure 9A:
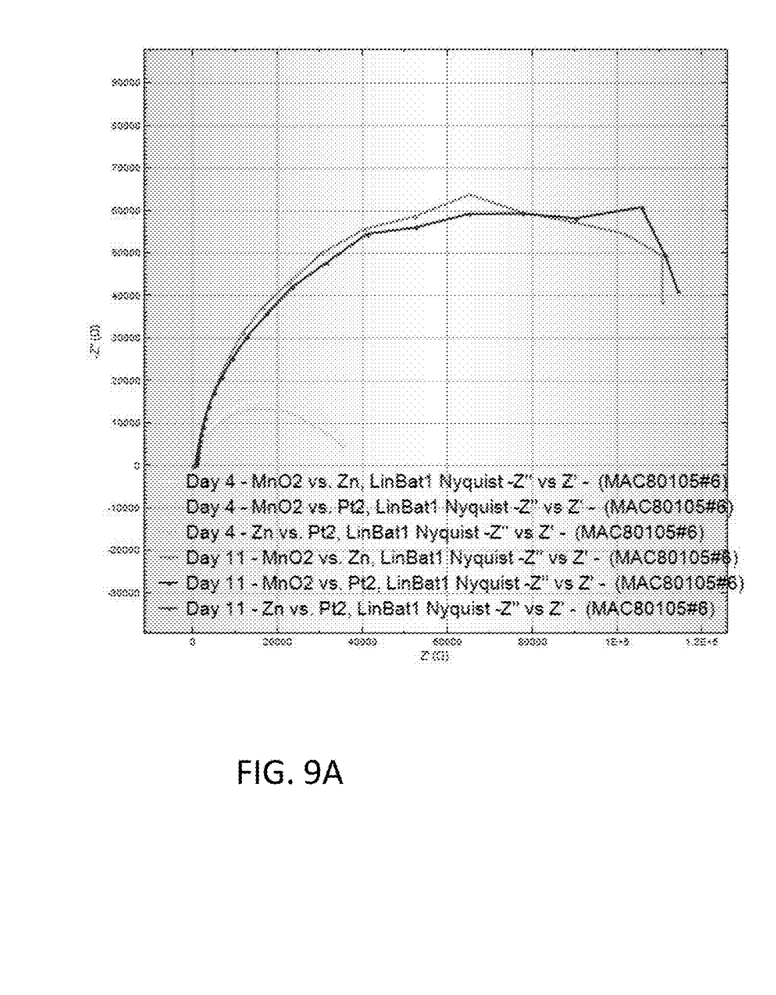
FIG. 9A is Nyquist plot of impedance analysis for an exemplary micro battery in accordance with the disclosure tested after being stored for four days and eleven days.
Figure 9B:
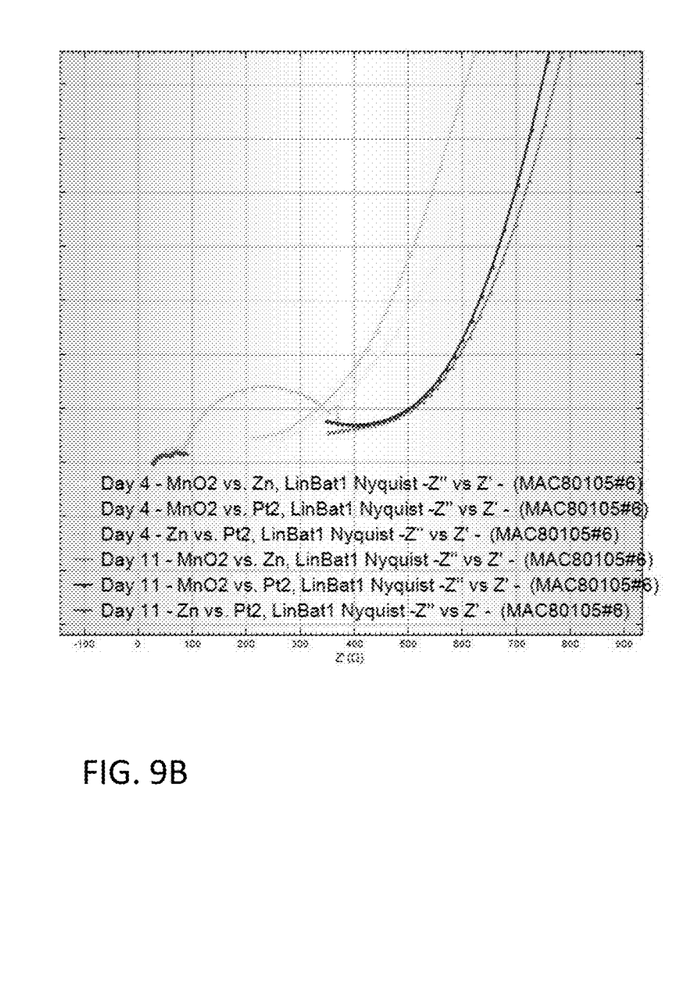
FIG. 9B is a rescaled Nyquist plot of impedance analysis for the exemplary micro battery in accordance with the disclosure in FIG. 9A.

A micro battery as depicted in FIG. 8, containing a $MnO_2$ cathode and a Zn anode was subjected to impedance testing after manufacture and over the course of storage at day four and day eleven. Nyquist plots of the impedance spectroscopy of the battery after being stored for four and eleven days are depicted in FIGS. 9A and 9B. Results are summarized in Table 3 below, wherein Rs is the resistance in series, Rc is the charge transfer resistance of the circuit for each designated set of electrodes.

TABLE 3

| Storage Time | O.C.P. | Impedance (Ohms) | |
| --- | --- | --- | --- |
| (Day) | (Volts) | Rs | Re |
| MnO2 versus Zn | | | |
| 4 | 1.58 | 240 | 40000 |
| 11 | 1.48 | 350 | 1.40E+05 |
| MnO2 versus Pt | | | |
| 4 | 1.0748 | 200 | 35000 |
| 11 | 0.957 | 346 | 1.40E+05 |
| Zn versus Pt | | | |
| 4 | −0.503 | 28 | 400 |
| 11 | −0.533 | 25 | 100 |

Table 3 shows, for example, a drop in O.C.P. over time that is associated with the cathode layer for the exemplary micro battery. At the same time, the resistance in series and resistance of the charge transfer increases over time for the cathode. The resistance of charge transfer resistance for the zinc anode versus the auxiliary electrode decreases over time. Thus, it is evident that the loss in performance over time of the exemplary micro battery is primarily associated with the MnO2 cathode.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A micro battery, comprising:
   a cathode layer;
   an anode layer physically separated from the cathode layer;
   an electrolyte layer in physical contact with the anode layer and the cathode layer; and
   at least one auxiliary electrode in physical contact with the electrolyte layer and one of the cathode layer or the anode layer, the auxiliary electrode comprising at least one metal coating and at least one non-conductive film, wherein the at least one metal coating is physically separated from the cathode and the anode.

2. The micro battery according to claim 1, comprising two auxiliary electrodes in physical contact with the electrolyte layer.

3. The micro battery according to claim 1, further comprising a first current collector in physical contact with the cathode layer and a second current collector in physical contact with the anode layer.

4. The micro battery according to claim 3, where the first and second current collectors comprise conductive materials selected from the group consisting of titanium, carbon, nickel, indium tin oxide.

5. The micro battery according to claim 1, wherein the auxiliary electrode is electrically isolated from the cathode layer and from the anode layer.

6. The micro battery according to claim 1, wherein the cathode layer comprises a cathode paste.

7. The micro battery according to claim 1, wherein the anode layer comprises zinc.

8. The micro battery according to claim 1, wherein the electrolyte layer comprises at least one electrolyte in a hydrogel.

9. The micro battery according to claim 1, wherein the metal coating is platinum or zinc.

10. The micro battery according to claim 1, wherein the non-conductive film is a polyimide film.

11. The micro battery according to claim 1, wherein the auxiliary electrode is removable.

12. A method of evaluating the micro battery of claim 1, comprising
   providing a micro battery comprising:
   a cathode layer;
   an anode layer physically separated from the cathode layer;
   an electrolyte layer in contact with the anode and the cathode; and
   at least one auxiliary electrode in physical contact with the electrolyte layer, the auxiliary electrode comprising at least one metal coating and at least one non-conductive film, wherein the at least one metal coating is physically separated from the cathode and the anode;
   forming a first electrical circuit between the auxiliary electrode and one of the cathode layer or the anode layer;
   applying an external electrical potential to the first electrical circuit; and
   measuring one or more of a cathode layer property and an anode layer property.

13. The method according to claim 12, further comprising:
   forming a second electrical circuit between the cathode and the anode;
   applying an external electrical potential to the second electrical circuit;
   measuring a battery property; and
   comparing the battery property to one or more of the anode layer property and the cathode layer property.

14. The method according to claim 13, wherein the battery property, the cathode layer property, and the anode layer property comprise a circuit resistance.

15. The method according to claim 13, wherein the battery property, the cathode layer property, and the anode layer property comprise a charge transfer resistance.

16. The method according to claim 13, wherein the battery property, the cathode layer property, and the anode layer property comprise an open circuit potential of the electrical circuit.

17. The method according to claim 12, wherein the at least one auxiliary electrode is ionically connected to the cathode layer and to the anode layer.

18. A method of evaluating the micro battery of claim 1, comprising
   providing a micro battery comprising:
   a cathode layer;
   an anode layer physically separated from the cathode layer;
   an electrolyte layer in contact with the anode layer and the cathode layer; and
   a first auxiliary electrode and a second auxiliary electrode, each of the first auxiliary electrode and the second auxiliary electrode in physical contact with the electrolyte layer and each comprising at least one metal coating and at least one non-conductive film, wherein the at least one metal coating is physically separated from the cathode and the anode;
   forming a first electrical circuit between the first auxiliary electrode and the second auxiliary electrode;
   applying an external electrical potential to the first electrical circuit; and
   measuring a property of the electrolyte layer.

19. The method according to claim 18, further comprising:
   forming a second electrical circuit between the cathode and the anode;
   applying an external electrical potential to the second electrical circuit;
   measuring a battery property; and
   comparing the battery property to the electrolyte layer property.

20. The microbattery according to claim 1, wherein the at least one auxiliary electrode is in physical contact with the cathode layer.

21. The microbattery according to claim 1, wherein the at least one auxiliary electrode is in physical contact with the anode layer.

* * * * *